(12) United States Patent
Hekmatshoartabari et al.

(10) Patent No.: US 10,115,833 B2
(45) Date of Patent: Oct. 30, 2018

(54) SELF-ALIGNED HETEROJUNCTION FIELD EFFECT TRANSISTOR

(71) Applicant: International Business Machines Corporation, Armonk, NY (US)

(72) Inventors: Bahman Hekmatshoartabari, White Plains, NY (US); Ghavam G. Shahidi, Pound Ridge, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/497,628

(22) Filed: Apr. 26, 2017

(65) Prior Publication Data

US 2017/0229588 A1    Aug. 10, 2017

Related U.S. Application Data

(62) Division of application No. 14/931,307, filed on Nov. 3, 2015, now Pat. No. 9,741,871.

(51) Int. Cl.
*H01L 29/80* (2006.01)
*H01L 29/06* (2006.01)
(Continued)

(52) U.S. Cl.
CPC ........ *H01L 29/802* (2013.01); *H01L 29/0649* (2013.01); *H01L 29/165* (2013.01); *H01L 29/456* (2013.01); *H01L 29/66916* (2013.01)

(58) Field of Classification Search
CPC .......................... H01L 29/8086; H01L 21/283
See application file for complete search history.

(56) References Cited

U.S. PATENT DOCUMENTS 3,996,656 A * 12/1976 Cook, Jr. ................ H01L 29/04
148/DIG. 122
5,266,825 A   11/1993 Tsukada et al.
(Continued)

FOREIGN PATENT DOCUMENTS

EP    0473988 A1    8/1991
JP    H03196575 A    8/1991
(Continued)

OTHER PUBLICATIONS

English translation for WO2015112472A1.
(Continued)

*Primary Examiner* — Moazzam Hossain
*Assistant Examiner* — Farun Lu
(74) *Attorney, Agent, or Firm* — Louis J. Percello; Ryan, Mason & Lewis, LLP

(57) ABSTRACT

A junction field effect transistor (JFET) comprises an insulating carrier substrate, a base semiconductor substrate formed on the insulating carrier substrate and a gate region formed on the base semiconductor substrate. The gate region forms a junction with the base semiconductor substrate. The JFET further comprises a first source/drain region formed on the base semiconductor substrate and located on a first side of the gate region and a second source/drain region formed on the base semiconductor substrate and located on a second side of the gate region. A gate stack is deposited on the gate region, a first source/drain stack is deposited on the first source/drain region and a second source/drain stack is deposited on the second source/drain region. At least one of the gate stack, first source/drain stack and second source/drain stack overlaps onto another one of the gate stack, first source/drain stack and second source/drain stack.

20 Claims, 8 Drawing Sheets

(51) Int. Cl.
*H01L 29/45* (2006.01)
*H01L 29/165* (2006.01)
*H01L 29/66* (2006.01)

(56) References Cited

U.S. PATENT DOCUMENTS

| | | |
|---|---|---|
| 5,340,999 A | 8/1994 | Takeda et al. |
| 5,567,633 A | 10/1996 | Gosain et al. |
| 5,728,610 A | 3/1998 | Gosain et al. |
| 5,834,796 A | 11/1998 | Matsuda et al. |
| 6,117,741 A | 9/2000 | Chatterjee et al. |
| 6,482,705 B1 | 11/2002 | Yu |
| 7,179,703 B2 | 2/2007 | Gonzalez et al. |
| 9,093,548 B2 | 7/2015 | Hekmatshoar-Tabari et al. |
| 2012/0305893 A1 | 12/2012 | Colinge |
| 2013/0328110 A1* | 12/2013 | Hekmatshoar-Tabari .............. H01L 29/808 257/256 |
| 2015/0206947 A1 | 7/2015 | Hekmatshoartabari et al. |
| 2015/0380450 A1 | 12/2015 | Okamoto et al. |

FOREIGN PATENT DOCUMENTS

| | | |
|---|---|---|
| WO | 9111027 A1 | 7/1991 |
| WO | 2015112472 A1 | 7/2015 |

OTHER PUBLICATIONS

English translation for Japanese Application No. JP2829754B2, which was also published as H03196575.
List of IBM Patents or Patent Applications Treated as Related.

* cited by examiner

100

PRIOR ART

300

310

320

400

410

420

430

600

610

620

622

SELF-ALIGNED HETEROJUNCTION FIELD EFFECT TRANSISTOR

BACKGROUND

A Si heterojunction field effect transistor (HJFET) was developed as a high-performance and low-cost alternative to the conventional thin-film transistor (TFT) on single or poly-crystalline Si substrates. Compared to a conventional TFT, in an HJFET: (i) gate dielectric is replaced with a stack of doped crystalline and/or non-crystalline semiconductor materials such as hydrogenated amorphous silicon (a-Si:H) grown by a deposition process such as plasma-enhanced chemical vapor deposition (PECVD), (ii) source/drain contacts are replaced with doped crystalline and/or non-crystalline semiconductor materials such as hydrogenated crystalline silicon (c-Si:H) and (iii) lightly-doped drain (LDD) regions are omitted. The HJFET enables significant cost reduction by employing the PECVD of a-Si:H and c-Si:H instead of the expensive process steps used for the conventional TFT and is particularly appealing for producing large-sized displays on low-temperature poly-Si (LTPS) substrates.

SUMMARY

Embodiments provide techniques for fabricating overlapping HJFET structures.

For example, in one embodiment, a junction field effect transistor (JFET) comprises an insulating carrier substrate, a base semiconductor substrate formed on the insulating carrier substrate, a gate region formed on the base semiconductor substrate wherein the gate region forms a junction with the base semiconductor substrate, a first source/drain region formed on the base semiconductor substrate and located on a first side of the gate region, a second source/drain region formed on the base semiconductor substrate and located on a second side of the gate region. The JFET also comprises a gate stack deposited on the gate region, a first source/drain stack deposited on the first source/drain region and a second source/drain stack deposited on the second source/drain region wherein at least one of the gate stack, first source/drain stack and second source/drain stack overlaps onto another one of the gate stack, first source/drain stack and second source/drain stack.

By way of further example in one embodiment, a portion of the base semiconductor substrate between the source region and the drain region is effective as the channel region of the JFET. The width of the depletion region associated with the junction formed between the gate region and the base semiconductor substrate within the channel region is modulated by the voltage bias applied to the gate electrode. The gate electrode of the JFET is therefore effective in modulating the current that flows between the drain electrode and the source electrode.

DETAILED DESCRIPTION

Embodiments will now be described in further detail with regard to techniques for forming an overlapping HJFET structures. It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

Figure 1:
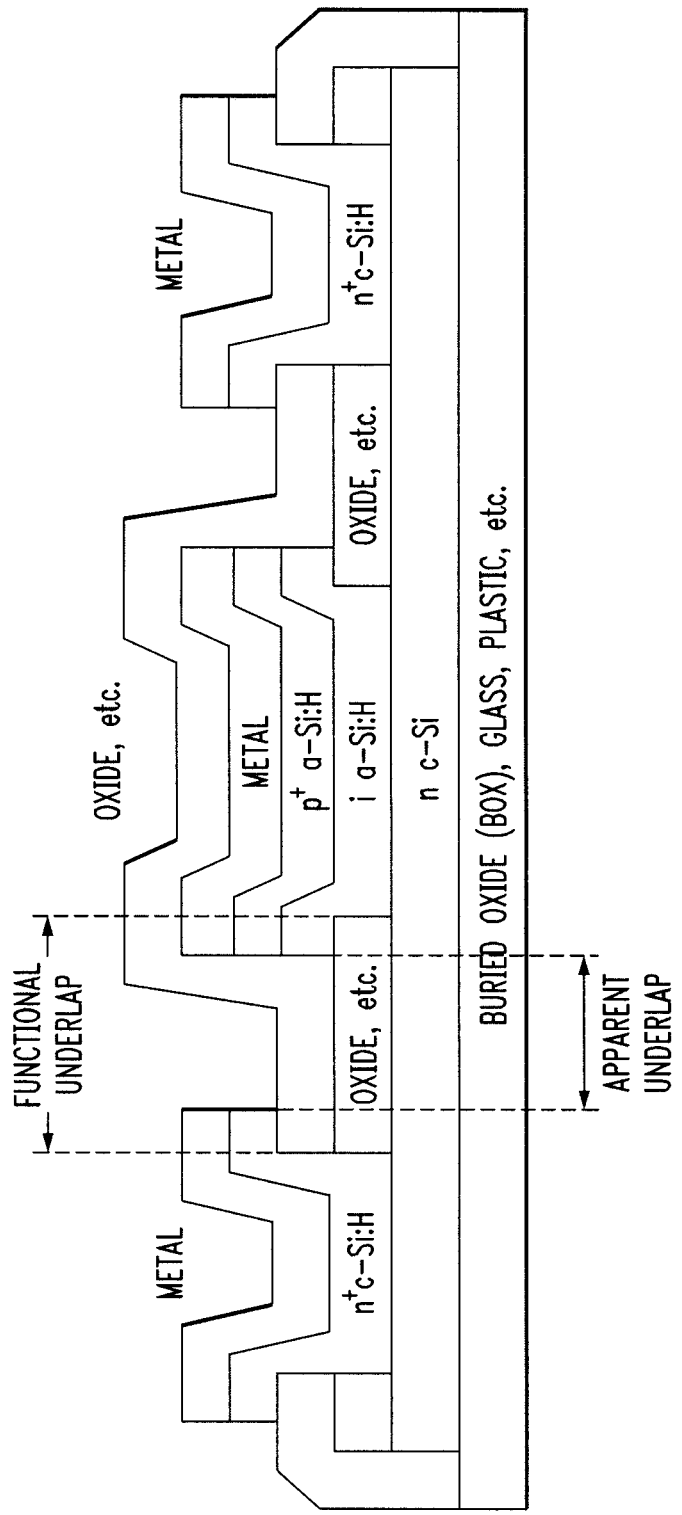
FIG. 1 is a schematic cross-sectional side view of an underlapped semiconductor structure.

Techniques for fabricating overlapping HJFET devices will now be discussed in further detail with reference to FIGS. 1-6D. It is to be appreciated that FIG. 1 is a schematic cross-sectional view of an HJFET. Such an HJFET structure as shown in FIG. 1 may be formed, for example, through a process described in U.S. Pat. No. 9,093,548 issued to Hekmatshoar-Tabari et al. on Jul. 28, 2015 and entitled "THIN FILM HYBRID JUNCTION FIELD EFFECT TRANSISTOR," the entire content of which is hereby incorporated by reference herein.

For example, FIG. 1 illustrates a gate region with a gate stack comprising a metal electrode and source/drain regions with respective source/drain stacks comprising respective metal electrodes. FIG. 1 also denotes the separation between the gate stack and the source/drain stacks as an "apparent underlap" and the separation between the gate region and the source/drain region as a "functional underlap" (only shown for one of the source and drain regions). The apparent underlap prevents the metal electrode on the gate stack from coming in direct contact with the metal electrodes on the source/drain stack, whereas the functional underlap separates the functional source/drain regions from the functional gate region. The apparent and functional underlaps may be defined by separate lithography steps. Devices such as the HJFET 100 of FIG. 1 may also be referred to as an "underlapped" or "non-self-aligned" device. The term "non-self-aligned" indicates that a separate patterning step is required to define the functional underlap. In contrast, as will be described in greater detail below, embodiments of the invention comprises an "apparent overlap." As used herein, an "apparent overlap" refers to a region where one of the source/drain stacks is placed on top of the other one. Spacers comprising insulating material prevent direct contact between semiconductor portions of each stack and therefore the functional underlap is equal to the spacer length. These HJFETs may also be referred to as "overlapped" or "self-aligned" devices.

Embodiments of the present invention may include one or more of the following features, characteristics and/or advantages: (1) an HJFET with a minimized functional underlap by depositing a gate stack that overlaps onto source/drain stacks; and (2) an HJFET with a minimized functional underlap by depositing source/drain stacks that overlap onto a gate stack. The functional underlap may be minimized because the length of a spacer may be sub-lithographic.

As a result, embodiments of the present invention recognize one or more of the following facts, potential problems and/or potential areas for improvement with respect to a non-self-aligned HJFET such as that of FIG. 1: (1) minimized source/drain series resistance associated with the functional underlap and therefore a lower source/drain series resistance for a given channel length; (2) more compact and/or shorter channel devices for a given lithography resolution; and (3) fewer lithography steps and therefore lower fabrication costs. One or more of the said potential areas of improvement may be advantageous for small and/or medium sized displays (e.g., in cell phones and/or tablets, respectively).

Figure 2:
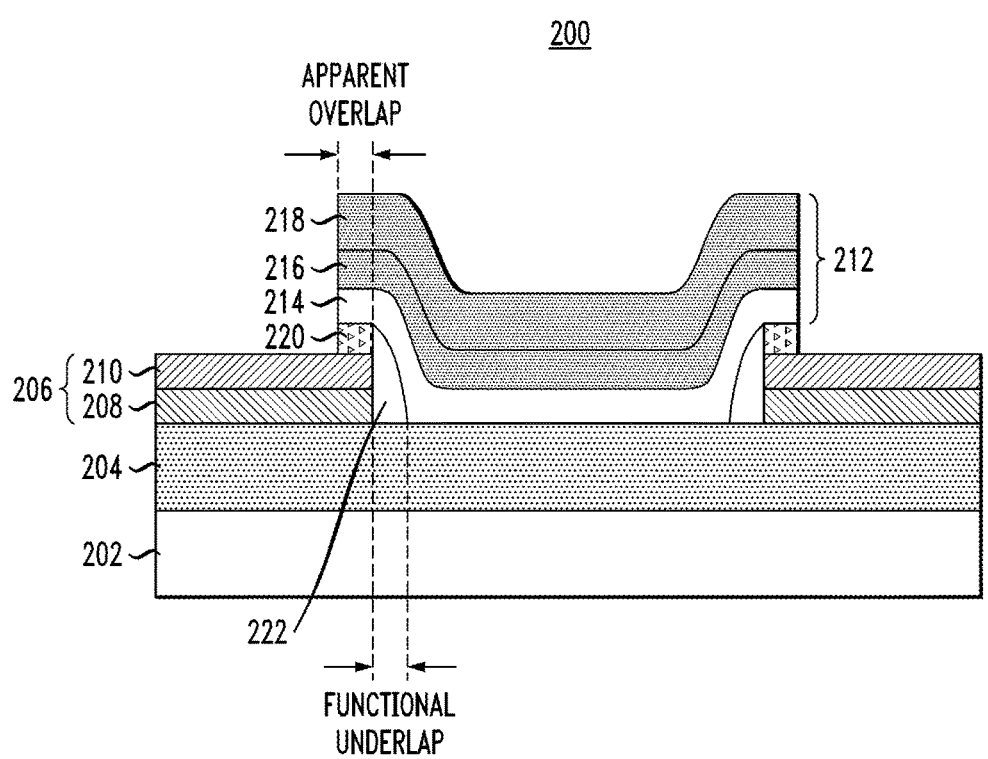
FIG. 2 is a schematic cross-sectional side view of an overlapping semiconductor structure according to a first embodiment of the invention.

FIG. 2 illustrates a first embodiment with HJFET 200. The HJFET 200 comprises an insulating carrier substrate 202. The insulating carrier substrate 202 may comprise, but is not limited to, a buried oxide (BOX), glass, and plastic. The HJFET 200 further comprises a base semiconductor substrate 204 formed on top of the insulating carrier substrate 202. The base semiconductor substrate 204 may comprise, but is not limited to, a crystalline semiconductor material. The crystalline semiconductor may comprise a first conductivity type, which can be either p-type or n-type. The HJFET 200 further comprises source/drain stacks 206 comprising, for example, a doped hydrogenated crystalline semiconductor material layer 208 and a source/drain metal electrode layer 210. Lastly, the HJFET 200 comprises a gate stack 212 comprising, for example, an intrinsic hydrogenated non-crystalline semiconductor material layer 214, a doped crystalline semiconductor material layer 216 comprising a second conductivity type and a gate metal electrode layer 218.

A portion of the base semiconductor substrate 204 between a source region and a drain region is effective as a channel region of the HJFET 200. The width of a depletion region associated with a junction formed between the gate region and the base semiconductor substrate 204 within the channel region is modulated by a voltage bias applied to the gate electrode. The gate electrode of the HJFET is therefore effective in modulating the current that flows between the drain electrode and the source electrode.

As shown in FIG. 2, the gate stack 212 overlaps onto the source/drain stacks 206. FIG. 2 also shows insulating layers 220 and 222, which prevent the semiconductor material portion of the gate stack 212 from coming in direct contact with the source/drain stacks 206. Such structures and/or arrangements, as shown in FIG. 2 through HJFET 200, are referred to herein as "gate-last" overlapping structures since the gate stack is formed after the source/drain stacks. Methods of forming such structures are described below with reference to FIGS. 3A-4H.

Referring now to FIGS. 3A-3F, there is illustrated a first set of processing steps of a method that can be employed in forming an exemplary gate-last overlapping HJFET within the first embodiment of the present disclosure.

Figure 3A:
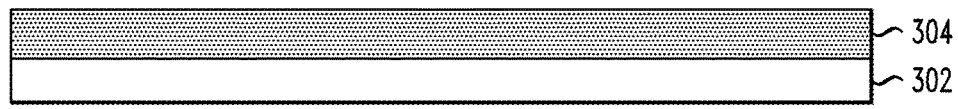
FIGS. 3A-3F are schematic cross-sectional side views illustrating a first set of processing steps for forming an exemplary overlapping semiconductor structure, according to a first embodiment of the invention.

In FIG. 3A, structure 300 comprises a carrier substrate 302, which in this example, is an insulating carrier substrate such as, but not limited to, buried oxide (BOX), glass and plastic. A base semiconductor substrate 304 is formed on top of the carrier substrate 302. The base semiconductor substrate 304 may comprise, for example, n-type c-Si semiconductor material. The neighboring devices may be isolated by patterning the base semiconductor substrate 304 at this stage or later in the fabrication process (not shown in FIGS. 3A-3F).

Figure 3B:
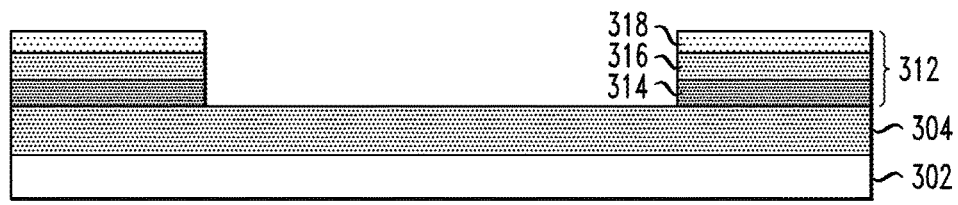

FIG. 3B illustrates structure 310 after deposition and patterning of source/drain stacks 312. The source/drain stacks 312 may comprise, for example, an n-doped hydrogenated crystalline semiconductor material layer 314, a source/drain metal electrode layer 316 and insulating layer 318, which may comprise, for example, oxide.

Figure 3C:
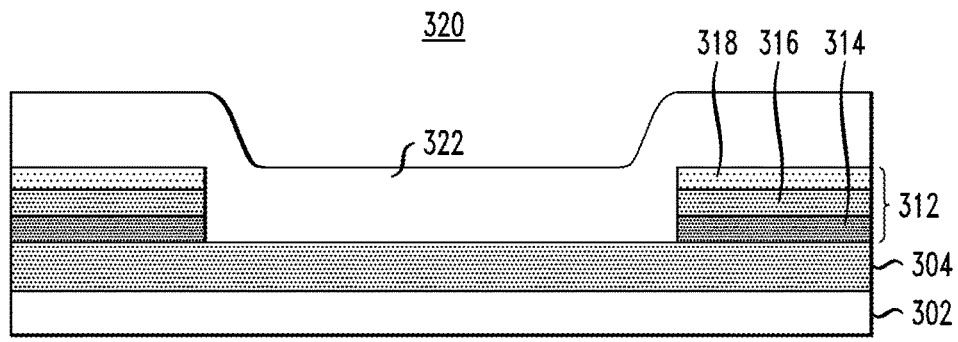

FIG. 3C illustrates structure 320 after depositing additional insulating layer 322. The additional insulating layer 322 may comprise the same material as the insulating layer 318 or may comprise a different type of insulating material. The additional insulating layer 322 may be deposited with a conformal deposition process such as, but not limited to, PECVD.

Figure 3D:
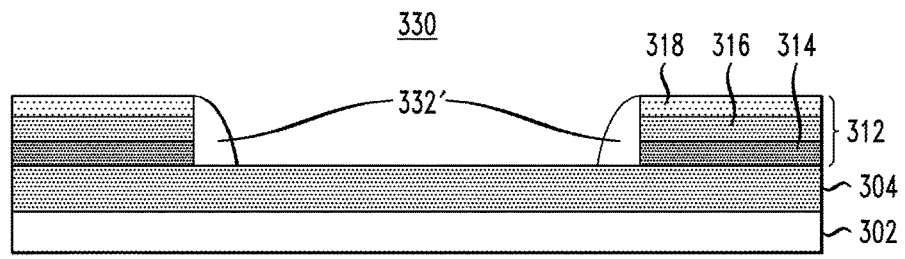

FIG. 3D illustrates structure 330 after performing an etch process on the additional insulating layer 322. The additional insulating layer 322 is etched away using an anisotropic etch process, e.g., reactive-ion etching (RIE) to form spacers 322'.

Figure 3E:
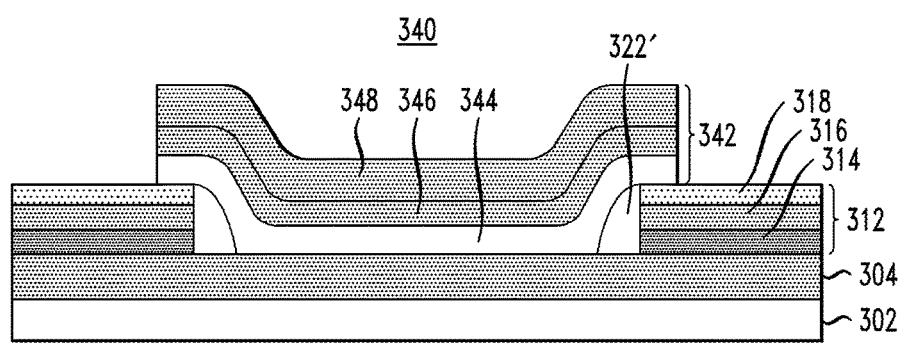

FIG. 3E illustrates structure 340 after deposition and patterning of a gate stack 342. The gate stack 342 may comprise, for example, an intrinsic amorphous hydrogenated non-crystalline semiconductor material layer 344, a p-doped crystalline semiconductor material layer 346 and a gate metal electrode layer 348. The gate stack 342 is patterned and deposited so that the edges of the gate stack 342 overlaps onto the source/drain stacks 312.

Figure 3F:
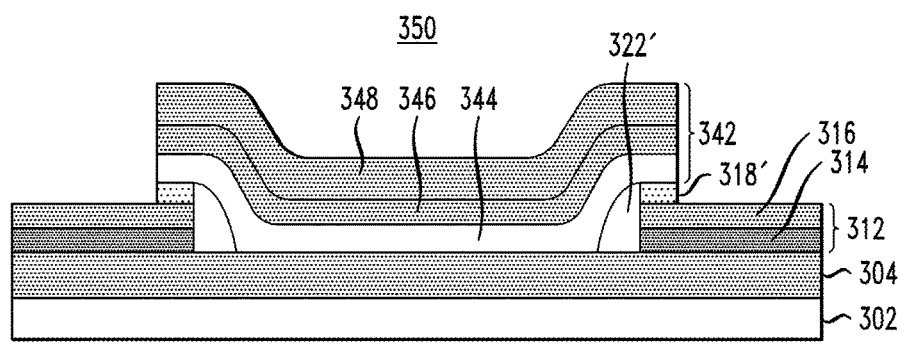

Lastly, FIG. 3F illustrates structure 350 after etching the insulating layer 318 on the source/drain stacks 312 to access the source/drain metal electrode layer 316. The gate stack 342 is used as a mask leaving a small residue of the insulating layer 318 now referred to as residue 318'. It will be appreciated by those skilled in the art that accessing the source/drain metal electrodes may be performed using a separate mask and/or during a different step following or accompanying the HJFET fabrication. For instance, the source/drain electrodes may be accessed after the deposition of a passivation layer over the fabricated HJFET during the integration of the HJFET backplane with the organic light-emitting diode (OLED) front-plane in an active-matrix OLED display.

The HJFET formed through processes shown with respect to FIGS. 3A-3F allows for the channel length to be as small as the lithographic feature size. This is because the spacer length can be sub-lithographic. For instance, with a resolution (smallest feature size) of ~2 µm in contact lithography, and any spacer length below 1 µm (for example, in the range of 50-500 nm, in some embodiments), the shortest separation possible between the source and drain regions, and therefore the channel length, is ~2 µm. In contrast, in the prior art HJFET, the channel length is larger than the minimum feature size. For instance, if contact lithography with a resolution of ~2 µm and an alignment tolerance (overlay registration) of ~1 µm is used for the fabrication of the exemplary prior art HJFET of FIG. 1, the shortest possible channel length is ~10 µm. Furthermore, regardless of the target channel length, since the physical underlap portions in the HJFETs within the embodiments of the present invention are minimized, the series resistance associated with the physical underlap is minimized accordingly, thus resulting in lower overall source/drain series resistance and accordingly higher drive current.

Referring now to FIGS. 4A-4H, there is illustrated a second set of processing steps of a method that can be employed in forming an exemplary gate-last HJFET within the first embodiment of the present disclosure.

Figure 4A:
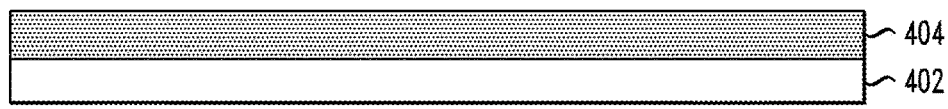
FIGS. 4A-4H are schematic cross-sectional side views illustrating a second set of processing steps for forming an exemplary overlapping semiconductor structure, according to a first embodiment of the invention.

FIG. 4A illustrates structure 400 comprising a carrier substrate 402 and a base semiconductor substrate 404. The carrier substrate 402 comprises transparent material such as for example, but not limited to, clear plastic and glass. The base semiconductor substrate 404 may comprise, for example, n-type c-Si semiconductor material. The neighboring devices may be isolated by patterning the base semiconductor substrate 404 at this stage or later in the fabrication process (not shown in FIGS. 4A-4F).

Figure 4B:
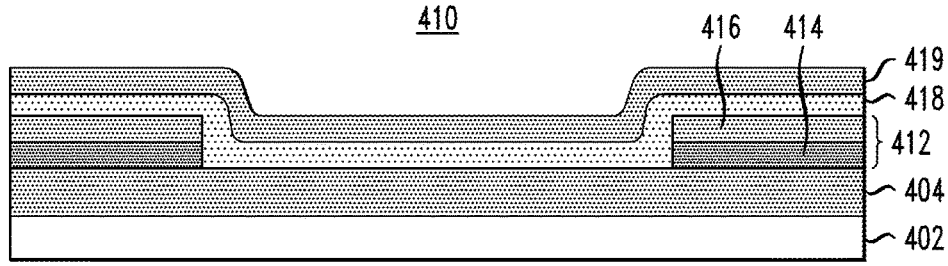

FIG. 4B illustrates structure 410 after deposition and patterning of source/drain stacks 412. The source/drain stacks 412 may comprise, for example, an n-doped hydrogenated crystalline semiconductor material layer 414 and a source/drain metal electrode layer 416. Structure 410 further comprises an insulating layer 418, comprising, for example, oxide, deposited over the entire base semiconductor substrate 404. Furthermore, structure 410 comprises a positive photoresist layer 419 deposited by a conventional process such as, for example, a spin-coating process.

Figure 4C:
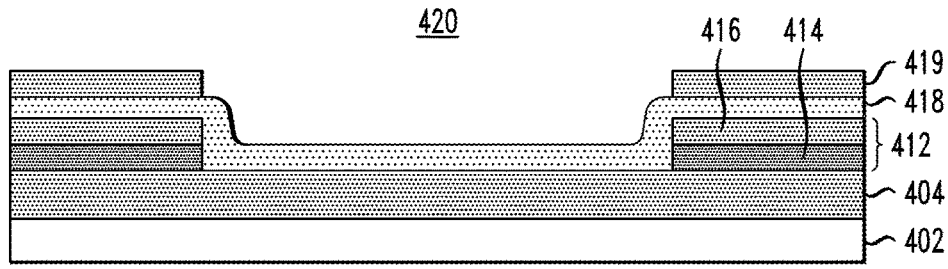

FIG. 4C illustrates structure 420 after patterning of the positive photoresist layer 419 by ultra-violet (UV) exposure from the back-side of the carrier substrate 402, followed by developing the photoresist in an appropriate developer. The remaining positive photoresist layer 419 is aligned with the source/drain metal electrode layer 416 as c-Si is thin, allowing sufficient transparency to UV light, whereas metal blocks the UV light.

Figure 4D:
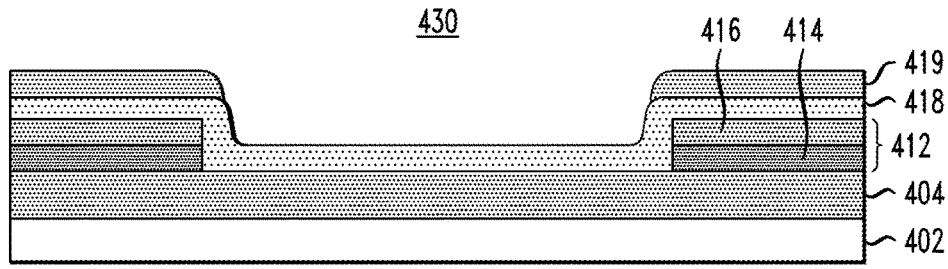

FIG. 4D illustrates structure 430 after performing a photoresist reflow by annealing at, for example, 120°-180° C., depending on the positive photoresist type as known in the art. After annealing, the remaining photoresist layer 419 protrudes beyond source/drain active regions.

Figure 4E:
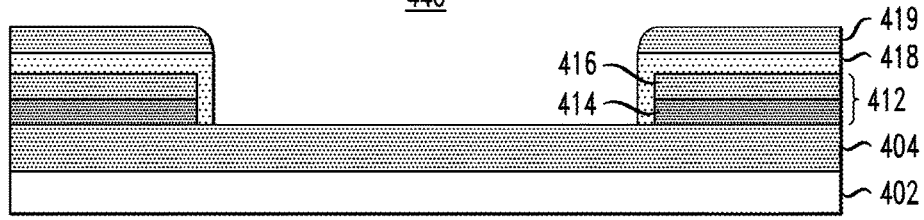

FIG. 4E illustrates structure 440 after patterning and etching away the insulating layer 418 using the remaining positive photoresist layer 419 as a mask.

Figure 4F:
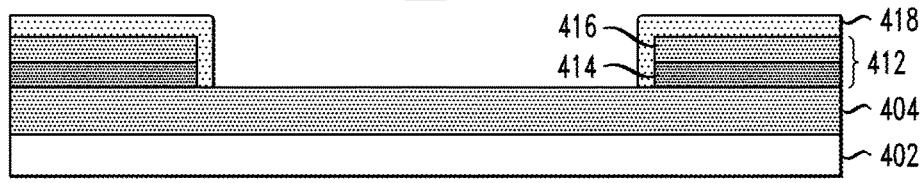

FIG. 4F illustrates structure 450 after removing the remaining photoresist layer 419 using an appropriate wet stripper and/or plasma ashing.

Figure 4G:
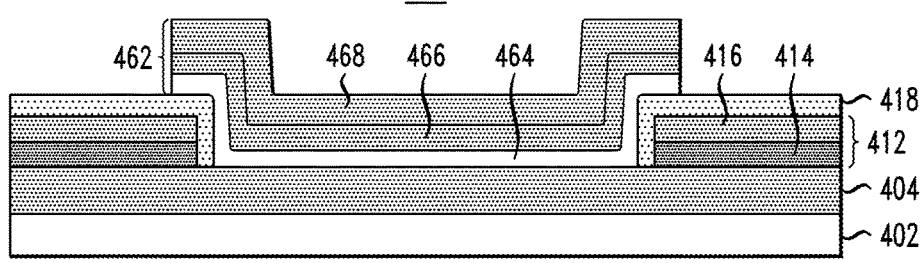

FIG. 4G illustrates structure 460 after deposition of a gate stack 462. The gate stack 462 may comprise, for example, an intrinsic amorphous hydrogenated non-crystalline semiconductor material layer 464, a p-doped crystalline semiconductor material layer 466 and a gate metal electrode layer 468. The gate stack 462 is patterned and deposited so that the edges of the gate stack 462 overlaps onto the source/drain stacks 412.

Figure 4H:
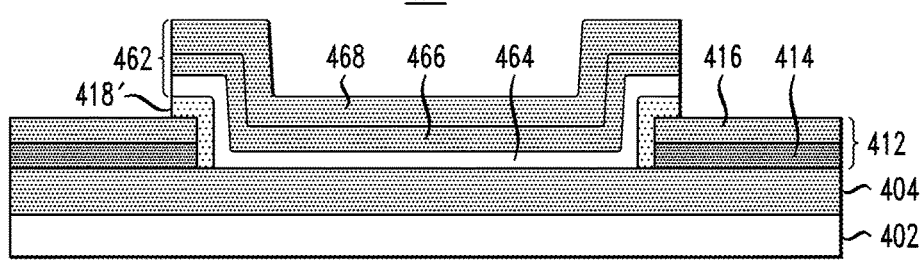

Lastly, FIG. 4H illustrates structure 470 after etching the insulating layer 418 to access the source/drain metal layer 416. The gate stack 462 is used as a mask leaving a residue of the insulating layer 418, which is now referred to as residue 418'. A portion of the residue 418' which is disposed on the sidewalls of the source/drain stacks 412 functions as a spacer. It will be appreciated that accessing the source/drain metal electrode may be performed using a separate mask and/or during a different step following or accompanying the HJFET fabrication depending on the intended application or the integration scheme.

Figure 5:
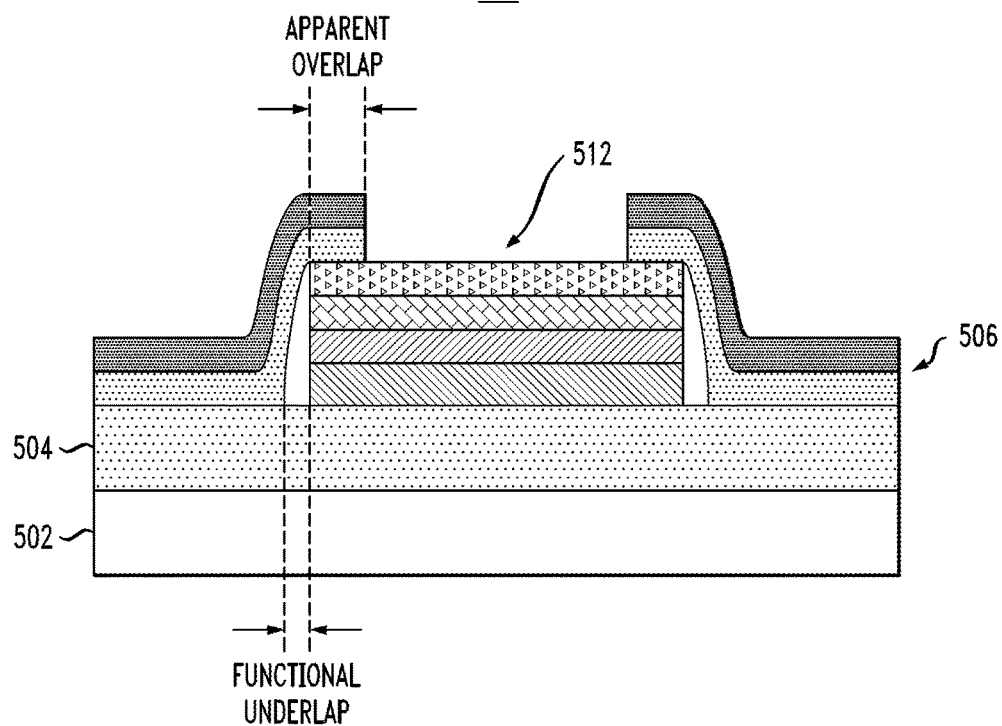
FIG. 5 is a schematic cross-sectional side view of an overlapping semiconductor structure according to a second embodiment of the invention.

FIG. 5 illustrates a second embodiment of the present invention with HJFET 500. Similar to FIG. 2, the HJFET 500 comprises an insulating carrier substrate 502, a base semiconductor substrate 504, source/drain stacks 506 and a gate stack 512. Both the source/drain stacks 506 and the gate stack 512 comprise similar layers as discussed with respect to FIG. 2. Unlike FIG. 2, the HJFET 500 in FIG. 5 illustrates the source/drain stacks 506 overlapping onto the gate stack 512. Such structures and/or arrangements, as shown in FIG. 5 through HJFET 500, are referred to herein as "gate-first" overlapping structures since gate is formed before the source/drain stacks. Methods of forming such structures are described below with reference to FIGS. 6A-6D.

Referring now to FIGS. 6A-6D, there is illustrated a set of processing steps of a method that can be employed in forming an exemplary gate-first HJFET within the second embodiment of the present disclosure.

Figure 6A:
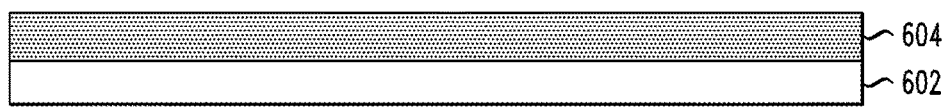
FIGS. 6A-6D are schematic cross-section side views illustrating a set of processing steps for forming an exemplary overlapping semiconductor structure, according to a second embodiment of the invention.

In FIG. 6A, structure 600 comprises a carrier substrate 602, which in this example, is an insulating substrate such as, but not limited to, buried oxide (BOX), glass and plastic. A base semiconductor substrate 604 is formed on top of the carrier substrate 602. The base semiconductor substrate 604 may comprise, for example, n-type c-Si semiconductor material. The neighboring devices may be isolated by patterning the base semiconductor substrate 604 at this stage or later in the fabrication process (not shown in FIGS. 6A-6D).

Figure 6B:
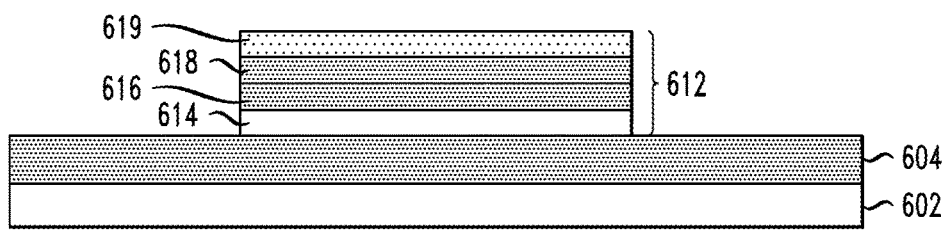

FIG. 6B illustrates structure 610 after deposition and patterning of a gate stack 612. The gate stack 612 may comprise, for example, an intrinsic amorphous hydrogenated non-crystalline semiconductor material layer 614, a p-doped crystalline semiconductor material layer 616 and a gate metal electrode layer 618. The gate stack 612 may also comprise an insulating layer 619, which may comprise, for example, oxide.

Figure 6C:
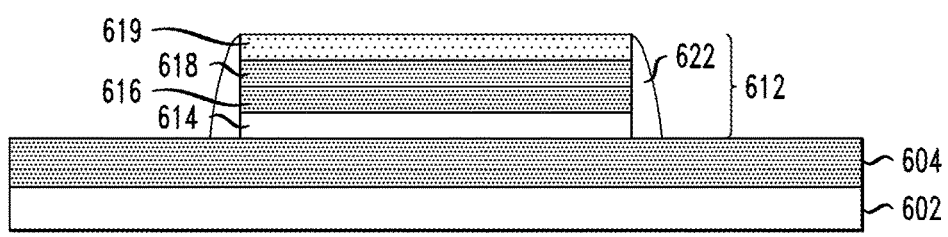

FIG. 6C illustrates structure 620 further comprising spacers 622. The spacers 622 may be formed by the conformal deposition of an additional insulating layer which may comprise the same material as or a different material than the insulating layer 619, followed by performing an anisotropic etch process on the said additional insulating layer (not shown). The conformal deposition process may include, but is not limited to, PECVD. The anisotropic etch process may include, but is not limited to, RIE.

Figure 6D:
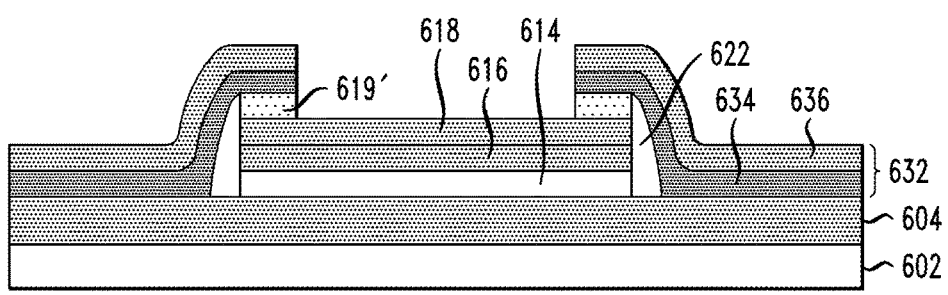

Lastly, FIG. 6D illustrates structure 630 after deposition and patterning of source/drain stacks 632. The source/drain stacks 632 may comprise, for example, an n-doped hydrogenated crystalline semiconductor material layer 634 and a source/drain metal electrode layer 636. Structure 630 also illustrates etching the insulating layer 619 to access the gate metal layer 618. The source/drain stacks 632 are used as a mask leaving portions insulating layer 619' underneath the source/drain stacks 632 and above the gate stack 612.

An exemplary gate-first HJFET structure within the second embodiment of the present disclosure may also be formed through a set of processing steps referred to in FIGS. 4A-4H. However, since each steps are substantially similar as described with respect to the first embodiment, details of such process are omitted for economy of the disclosure.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A junction field effect transistor comprising:
   an insulating carrier substrate;
   a base semiconductor substrate formed on the insulating carrier substrate;
   a gate region formed on the base semiconductor substrate wherein the gate region forms a junction with the base semiconductor substrate;
   a first source/drain region formed on the base semiconductor substrate and located on a first side of the gate region;
   a second source/drain region formed on the base semiconductor substrate and located on a second side of the gate region; and
   a gate stack deposited on the gate region, a first source/drain stack deposited on the first source/drain region and a second source/drain stack deposited on the second source/drain region;
   wherein at least a portion of the first source/drain stack and a portion of the second source/drain stack overlaps a top surface of the gate stack in the gate region.

2. The junction field effect transistor of claim 1, wherein the gate stack is deposited on the gate region prior to depositing the first and second source/drain stacks and at least one of the first and second source/drain stacks is patterned to be larger in size than the respective first and second source/drain regions and overlap onto the gate stack.

3. The junction field effect transistor of claim 1, further comprising a spacer preventing a semiconductor material portion of the gate stack from being in contact with semiconductor material portions of the first and second source/drain stacks.

4. The junction field effect transistor of claim 3, wherein the spacer is of insulating material.

5. The junction field effect transistor of claim 1, wherein at least one of the first source/drain stack and second source drain stack comprises an insulating layer.

6. The junction field effect transistor of claim 1, wherein the gate stack comprises an intrinsic semiconductor layer having a bottom portion in contact with the base semiconductor substrate, a doped crystalline semiconductor material layer and a gate metal electrode layer.

7. The junction field effect transistor of claim 1, wherein the gate stack comprises an intrinsic hydrogenated non-crystalline semiconductor layer having a bottom portion in contact with the base semiconductor substrate, a doped crystalline semiconductor material layer formed on the intrinsic hydrogenated non-crystalline semiconductor layer and a gate metal electrode layer formed on the doped crystalline semiconductor material layer.

8. A method comprising:
   providing an insulating carrier substrate;
   forming a base semiconductor substrate on the insulating carrier substrate;
   forming a gate region on the base semiconductor substrate wherein the gate region forms a junction with the base semiconductor substrate;
   forming a first source/drain region on the base semiconductor substrate on a first side of the gate region;
   forming a second source/drain region on the base semiconductor substrate on a second side of the gate region; and
   depositing a gate stack on the gate region, a first source/drain stack on the first source/drain region and a second source/drain stack on the second source/drain region,
   wherein at least a portion of the first source/drain stack and a portion of the second source/drain stack overlaps a top surface of the gate stack in the gate region.

9. The method of claim 8, wherein the gate stack is deposited prior to depositing the first and second source/drain stacks and at least one of the first and second source/drain stacks is patterned to be larger in size than the respective first and second source/drain regions and overlap onto the gate stack.

10. The method claim 8, further comprising a spacer preventing a semiconductor material portion of the gate stack from being in contact with semiconductor material portions of the first and second source/drain stacks.

11. The method of claim 10, wherein the spacer is of insulating material.

12. The method of claim 10, wherein at least one of the first source/drain stack and second source drain stack comprises an insulating layer.

13. The method of claim 10, wherein the gate stack comprises an intrinsic semiconductor layer having a bottom portion in contact with the base semiconductor substrate, a doped crystalline semiconductor material layer and a gate metal electrode layer.

14. The method of claim 10, wherein the gate stack comprises an intrinsic hydrogenated non-crystalline semiconductor layer having a bottom portion in contact with the base semiconductor substrate, a doped crystalline semiconductor material layer formed on the intrinsic hydrogenated non-crystalline semiconductor layer and a gate metal electrode layer formed on the doped crystalline semiconductor material layer.

15. An integrated circuit comprising:
an insulating carrier substrate;
a base semiconductor substrate formed on the insulating carrier substrate;
a gate region formed on the base semiconductor substrate wherein the gate region forms a junction with the base semiconductor substrate;
a first source/drain region formed on the base semiconductor substrate and located on a first side of the gate region;
a second source/drain region formed on the base semiconductor substrate and located on a second side of the gate region; and
a gate stack deposited on the gate region, a first source/drain stack deposited on the first source/drain region and a second source/drain stack deposited on the second source/drain region,
wherein at least a portion of the first source/drain stack and a portion of the second source/drain stack overlaps a top surface of the gate stack in the gate region.

16. The integrated circuit of claim 15, wherein the gate stack is deposited prior to depositing the first and second source/drain stacks and at least one of the first and second source/drain stacks is patterned to be larger in size than the respective first and second source/drain regions and overlap onto the gate stack.

17. The integrated circuit of claim 15, further comprising a spacer preventing a semiconductor material portion of the gate stack from being in contact with semiconductor material portions of the first and second source/drain stacks.

18. The integrated circuit of claim 17, wherein the spacer is of insulating material, and wherein at least one of the first source/drain stack and second source drain stack comprises an insulating layer.

19. The integrated circuit of claim 15, wherein the gate stack comprises an intrinsic semiconductor layer having a bottom portion in contact with the base semiconductor substrate, a doped crystalline semiconductor material layer and a gate metal electrode layer.

20. The integrated circuit of claim 15, wherein the gate stack comprises an intrinsic hydrogenated non-crystalline semiconductor layer having a bottom portion in contact with the base semiconductor substrate, a doped crystalline semiconductor material layer formed on the intrinsic hydrogenated non-crystalline semiconductor layer and a gate metal electrode layer formed on the doped crystalline semiconductor material layer.

\* \* \* \* \*